US005536467A

United States Patent [19]
Reichle et al.

[11] Patent Number: 5,536,467
[45] Date of Patent: Jul. 16, 1996

[54] METHOD AND APPARATUS FOR PRODUCING A THREE-DIMENSIONAL OBJECT

[75] Inventors: Johannes Reichle, München; Hans J. Langer, Gräfelfing, both of Germany

[73] Assignee: EOS GmbH Electro Optical Systems, Planegg, Germany

[21] Appl. No.: 307,604

[22] PCT Filed: Dec. 30, 1993

[86] PCT No.: PCT/EP93/03724

§ 371 Date: Sep. 20, 1994

§ 102(e) Date: Sep. 20, 1994

[87] PCT Pub. No.: WO94/16875

PCT Pub. Date: Aug. 4, 1994

[30] Foreign Application Priority Data

Jan. 28, 1993 [DE] Germany ............... 43 02 418.1

[51] Int. Cl.⁶ .................... B29C 35/08; B29C 41/02; B29C 41/52
[52] U.S. Cl. .................. 264/401; 118/429; 118/620; 118/712; 156/64; 156/272.8; 156/273.5; 156/275.5; 156/307.1; 156/378; 156/379.6; 250/432 R; 250/492.1; 264/40.1; 264/308; 359/204; 425/135; 425/174.4; 427/8; 427/510; 427/512; 427/553; 427/554; 427/555
[58] Field of Search ............ 264/22, 40.1, 236, 264/308, 401; 425/135, 174.4; 156/64, 272.8, 273.3, 273.5, 275.5, 307.1, 378, 379.6; 427/8, 508, 510, 512, 553, 554, 555; 118/429, 620, 712; 250/432 R, 492.1; 359/204; 364/468, 476; 395/119

[56] References Cited

U.S. PATENT DOCUMENTS 3,732,796  5/1973  Marcy ............................... 354/4
4,561,717  12/1985  Kataoka et al. .................... 359/204
5,120,476  6/1992  Scholz ................................ 264/22
5,139,711  8/1992  Nakamura et al. ................. 264/22

FOREIGN PATENT DOCUMENTS

| 171069 | 2/1986 | European Pat. Off. |
| 393676 | 10/1990 | European Pat. Off. |
| 406513 | 1/1991 | European Pat. Off. |
| 435102 | 7/1991 | European Pat. Off. |
| 459635 | 12/1991 | European Pat. Off. |
| 470705 | 2/1992 | European Pat. Off. |
| 3333386 | 4/1985 | Germany . |
| 61-116322 | 6/1986 | Japan ................... 425/174.4 |
| 61-116320 | 6/1986 | Japan ................... 425/174.4 |
| 62-23719 | 1/1987 | Japan ................... 264/22 |
| 63-145015 | 6/1988 | Japan ................... 425/174.4 |
| 3224726 | 10/1991 | Japan . |

OTHER PUBLICATIONS

European Search Report (dated Mar. 2, 1994).

*Primary Examiner*—Leo B. Tentoni
*Attorney, Agent, or Firm*—Donald Brown; George W. Neuner

[57] ABSTRACT

A method for producing an object by layerwise solidification of the object by means of electromagnetic radiation is expedited by simultaneously solidifying the material of a layer at a plurality of places.

An apparatus for carrying out the method comprises an irradiation device (11, 12, 14, 15, 16) generating a plurality of beams (20, 21, 22) as well as a control device (7, 17, 18, 19) directing each of the plurality of beams independently to different regions of the layer (8a . . . 8d).

5 Claims, 1 Drawing Sheet

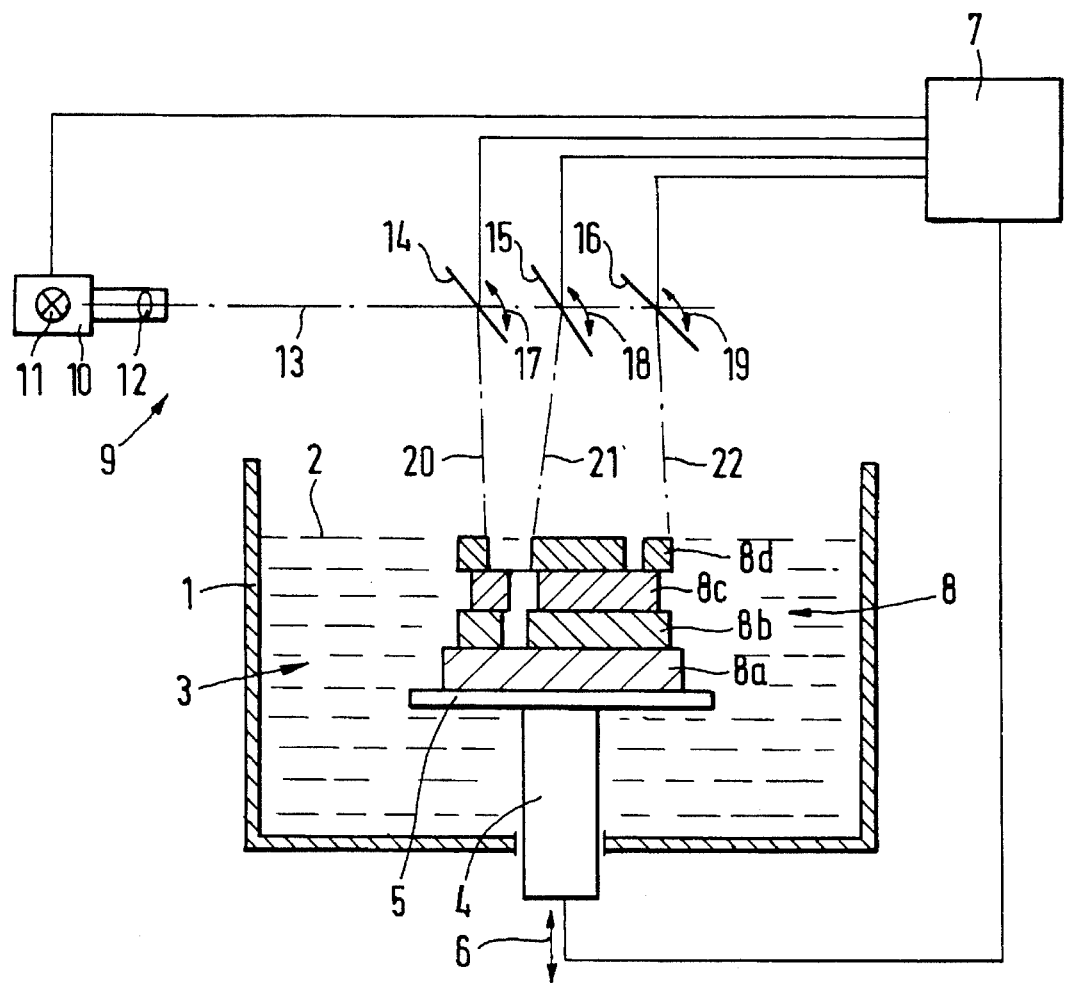

METHOD AND APPARATUS FOR PRODUCING A THREE-DIMENSIONAL OBJECT

The invention relates to a method and an apparatus for producing a three-dimensional object.

Such a method or apparatus, resp., is known from document EP-A-0 171 069 wherein the support is lowered within a bath of liquid resin which can be polymerized, so as to form a layer of liquid resin, and this layer is thereafter polymerized or solidified, resp., at the points thereof corresponding to the object by irradiation with a laser beam. Since the polymerization requires a determined reaction time, the laser beam can not be scanned across the layer at any speed whatsoever and the production time can therefore not be freely reduced.

It is the object of the invention to reduce the time required for the production of the object.

In the following the invention will be described with reference to an embodiment in connection with the figure which shows a partly sectioned schematic representation of an embodiment of the inventive apparatus.

A top open tank 1 is filled with a light-curable liquid resin material 3 up to a level or surface 2. Within the tank 1 and the volume of the resin 3 there is a support 4 having a substantially plane and horizontal support plate 5 which is parallel to the surface 2 and may be displaced and positioned in direction perpendicular to the surface 2 and to the support plate 5, resp., by means of a schematically indicated elevation adjustment device 6. The elevation adjustment device is connected with a control device 7 for controlling the displacement position.

The object 8 which is formed by a plurality of layers 8a, 8b, 8c and 8d in the manner described below is on the support plate.

An irradiation device 9 for solidifying the uppermost layer 8d adjacent to the surface 2 comprises an illumination device 10 having a radiation source 11 which generates a focussed or directed beam 13 through a lense system 12. Preferably the radiation source 11 is a light source such as a laser, but may be any other source of electromagnetic radiation. In the region above the tank 1 or above the surface 2, resp., a plurality of, for example three, mirrors 14, 15, 16 which are each semi-transparent are disposed one behind the other in direction of the beam 13. The mirrors 14, 15, 16 are each independently mounted on gimbals and can be pivoted by means of schematically indicated driving devices 17, 18, 19 in such a manner that the beam 13 impinging on the mirrors 14, 15, 16 can be positioned by the mirrors 14, 15, 16 as respective independent reflected beams 20, 21, 22 within predetermined regions of the surface 2. Alternatively also two rotating mirrors, a respective one for each coordinate direction, may be used in conventional manner.

The driving devices 17, 18, 19 are each connected with the control device 7 for controlling the direction of the beams 20, 21, 22.

In operation data about the shape of the object 8 as obtained by a design program or the like are first stored within the control device 7. For producing the object 8 those data are processed so that the object is decomposed into a large number of horizontal layers which are each thin as compared to the object dimension and form data for each layer are provided.

For producing the first layer 8a the control device 7 controls the elevation adjustment device 6 to position the surface of the support plate 5 to a predetermined elevation below the surface 2 corresponding to the thickness of the layer 8a. Hence, a liquid resin layer having a thickness corresponding to the desired layer 8a exists between the surface of the support plate 5 and the surface 2.

Thereafter the control device 7 controls the irradiation device 9 and in particular the driving devices 17, 18, 19 so as to direct the beams 20, 21, 22 reflected from each corresponding mirror 14, 15, 16 onto predetermined regions of the layer 8a and to thereby solidify those regions. For example a boundary region of the first layer 8a can be solidified by a first beam 21 deflected by the intermediate mirror 15 and the central region of the layer 8a can be solidified by the other two beams 20, 22. In this manner the boundary region is solidified along a closed path which provides for an improved and in particular smoother stepless surface of the object. The inner region may then be solidified by the other beams 20, 22 in such a manner that those beams scan adjacent linear regions or each beam 20, 22 solidifies a separate region or a separate field of the layer, resp. In the latter case it is advantageous that the operative range of the mirrors 14 and 16 can be smaller or, with the same operative region of the mirrors, the size of the solidifiable layer is increased, resp. Anyway, it is important that a plurality of regions corresponding to the number of beams is simultaneously solidified owing to the simultaneous irradiation by means of the beams 20, 21, 22 so that the layer 8a is produced in a shorter time in spite of the constant reaction time of the material.

After producing the first layer 8a the elevation adjustment device 6 is lowered by the control device 7 by the amount of the intended thickness of the second layer 8b so that a liquid layer having the thickness of the second layer 8b is formed on the first layer 8a. Thereafter the driving devices 17, 18, 19 are controlled for solidifying the second layer in analogous manner as in the first layer. The following layers 8c, 8d are produced in corresponding manner.

In place of the single radiation source 11 having a plurality of mirrors 14, 15, 16 which is disadvantageous in that the light power of the reflected beams 20, 21, 22 is reduced corresponding to the number of mirrors a plurality of radiation sources 11 each having an associated mirror or deflection device, resp., for the light beam may be provided. It is a particularly advantageous modification of the described apparatus to provide one radiation source and 5 mirrors whereby four mirrors are annularly positioned around a fifth central mirror. Each mirror is provided with a corresponding control or deflection device for the respective light beam and is controlled by the control device 7 for solidifying individual regions of the layers 8a . . . 8d. It is particularly advantageous to control the central mirror so as to take over the solidification of the boundary region of the layer as with mirror 15.

Rather than by using mirrors the brake-up of the beam 13 and the separate deflection of the partial beams can also be obtained by a plurality of optical fibres whereby the beam 13 enters at one end of the fibres and the other end thereof is scanned across the surface by means of a per se known x,y-positioning device in a manner corresponding to the beams 20, 21, 22. A further possible modification is the use of a plastic, metal or plastic-coated metal or ceramic powder in place of the liquid resin. Any suitable methods such as dispensing or spraying devices, blades, drums, etc., may be used for applying a layer of this material. The solidification of the material can also be made in function of the characteristics thereof by other forms of electromagnetic radiation, such as cathode rays or heat radiation.

We claim:

1. A method for producing an object by layerwise solidification of a material which is solidifiable by electromagnetic radiation, the method comprising the steps of (a) generating a layer of said material, (b) producing a beam of electromagnetic radiation, (c) dividing said beam into a plurality of beams, (d) controllably directing each one of said plurality of said beams independently onto a predetermined region of said layer, (e) solidifying said regions, and (f) repeating steps (a) to (e) until said object is formed.

2. The method of claim 1, comprising using one of said plurality of beams for solidifying a contour of said object and using the other of said plurality of beams for solidifying an inner region of said layer which is surrounded by said contour.

3. An apparatus for producing an object from a material which is solidifiable by electromagnetic radiation, the apparatus comprising:

support means for said object, means for applying a layer of said material to said support means, irradiation means for producing a plurality of beams of electromagnetic radiation, and control means for independently directing each one of said plurality of beams onto corresponding predetermined regions of said layer, wherein said irradiation means comprises a single radiation source generating a single beam and a plurality of semi-transparent mirrors which are each controlled by said control means.

4. The apparatus of claim 3, comprising means for arranging said mirrors along the axis of said single beam.

5. The apparatus of claim 3, comprising five mirrors and means for arranging said five mirrors such that a central mirror is surrounded by four outer mirrors.

* * * * *